United States Patent
Yoshino et al.

(10) Patent No.: US 9,934,888 B2
(45) Date of Patent: Apr. 3, 2018

(54) CABLE FOR DIFFERENTIAL SERIAL TRANSMISSION

(71) Applicant: SONY SEMICONDUCTOR SOLUTIONS CORPORATION, Kanagawa (JP)

(72) Inventors: Yoshitaka Yoshino, Tokyo (JP); Satoru Tsuboi, Kanagawa (JP); Makoto Makishima, Saitama (JP); Tomomichi Murakami, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/519,415

(22) PCT Filed: Oct. 20, 2015

(86) PCT No.: PCT/JP2015/005281
§ 371 (c)(1),
(2) Date: Apr. 14, 2017

(87) PCT Pub. No.: WO2016/063520
PCT Pub. Date: Apr. 28, 2016

(65) Prior Publication Data
US 2017/0236622 A1    Aug. 17, 2017

(30) Foreign Application Priority Data
Oct. 22, 2014    (JP) .................. 2014-215031

(51) Int. Cl.
*H01B 11/18* (2006.01)
*H05K 9/00* (2006.01)
(Continued)

(52) U.S. Cl.
CPC ......... *H01B 11/1895* (2013.01); *H01B 1/026* (2013.01); *H01B 9/006* (2013.01);
(Continued)

(58) Field of Classification Search
CPC ..... H01B 11/1895; H01B 11/02; H01B 11/20; H01B 1/026; H01B 9/006; H05K 9/0075
See application file for complete search history.

(56) References Cited

U.S. PATENT DOCUMENTS

2004/0222012 A1*  11/2004  Wlos ................ H01B 7/1825
                                                   174/128.1
2006/0021786 A1*   2/2006  Fetterolf, Sr. ......... H01B 9/02
                                                   174/113 R
(Continued)

FOREIGN PATENT DOCUMENTS

JP    63-013809 U    8/1989
JP    10-031913 A    2/1998
(Continued)

*Primary Examiner* — Timothy Thompson
*Assistant Examiner* — Amol Patel
(74) *Attorney, Agent, or Firm* — Chip Law Group

(57) ABSTRACT

Provided is a cable including: at least two signal cables formed of first and second signal cables for differential transmission; a third cable for ground; a fourth cable for power supply; a metal sheet adapted to cover the first and second signal cables; a coating material adapted to house the first and second signal cables covered with the metal sheet, and the third and fourth cables; and a magnetic powder-mixed resin filled into an inner space of the coating material and prepared by mixing magnetic powder with a resin.

12 Claims, 11 Drawing Sheets

(51) Int. Cl.
*H01B 11/02* (2006.01)
*H01B 9/00* (2006.01)
*H01B 1/02* (2006.01)
*H01B 11/20* (2006.01)

(52) U.S. Cl.
CPC ............ *H01B 11/02* (2013.01); *H01B 11/20* (2013.01); *H05K 9/0075* (2013.01)

(56) References Cited

U.S. PATENT DOCUMENTS

2006/0054334 A1* 3/2006 Vaupotic ............ H01B 11/1008
174/36
2015/0221418 A1* 8/2015 Sumi ...................... H01B 11/04
174/34
2015/0357087 A1* 12/2015 Sumi ................ H01B 11/1083
174/118

FOREIGN PATENT DOCUMENTS

| JP | 2001-110254 A |   | 4/2001 |
|----|---------------|---|--------|
| JP | 2004111178 A  | * | 4/2004 |
| JP | 2004-158328 A |   | 6/2004 |
| JP | 4032898 B2    |   | 1/2008 |
| JP | 2009-224075 A |   | 10/2009 |

* cited by examiner

CABLE FOR DIFFERENTIAL SERIAL TRANSMISSION

CROSS REFERENCE TO RELATED APPLICATIONS

This application is a U.S. National Phase of International Patent Application No. PCT/JP2015/005281 filed on Oct. 20, 2015, which claims priority benefit of Japanese Patent Application No. JP 2014-215031 filed in the Japan Patent Office on Oct. 22, 2014. Each of the above-referenced applications is hereby incorporated herein by reference in its entirety.

TECHNICAL FIELD

The present disclosure relates to a cable that can be applied to differential serial transmission standards such as a universal serial bus (UBS) and a high-definition multimedia interface (HDMI) (registered trademark).

BACKGROUND ART

A cable used for the USB standard (USB cable) has four electric wires including a pair of differential data lines, a power line, and a ground line. Generally, a shield layer braided with a copper wire is provided in order to suppress noise emission from the cable to the outside and entrance of an electromagnetic wave from the outside to the inside. The shield layer has both end portions each connected to a ground potential portion.

However, in the case where the ground potential is not ensured, there may be a problem in which an electromagnetic shielding effect becomes insufficient. Furthermore, in the case where ground potential of two apparatuses to be connected are not equal, there may be a problem in which current flows via the shield layer and noise is transmitted to the apparatuses. Additionally, there are proposed measures against such problems, in which noise is suppressed by using a resin obtained by mixing a coating material to coat the shield layer with an electric wave absorbing material such as ferrite. Furthermore, the measures are taken by providing a noise suppressing member such as an inductance at a connecting portion of a cable connected to an apparatus.

For example, Patent Document 1 discloses, in FIG. 2, a structure in which a conductor 1 includes a plurality of insulating electric wires 3 coated with an insulating body 2, a braided copper 4 is wound around the outside thereof, additionally a sheath 5 made of an insulating material is disposed outside thereof, and a ferrite-containing resin 6 is provided between the insulating electric wire 3 and the braided copper 4. Such a cable disclosed in Patent Document 1 can reduce noise of a high frequency zone (10 kHz to 1 GHz) by the braided copper 4, can suppress noise (1 kHz to 10 kHz) by ferrite powder contained in the insulating body 2, and can reduce noise of a lower frequency zone by the ferrite-containing resin 6.

Patent Document 2 states that: the technology disclosed in Patent Document 1 includes the shield layer, and when the shield layer is not surely connected to reference potential, there may be a problem in which EMI noise is emitted to the outside from the shield layer.

CITATION LIST

Patent Document

Patent Document 1: Japanese Patent Application Laid-Open No. 10-31913
Patent Document 2: Japanese Patent No. 4032898

SUMMARY OF THE INVENTION

Problems to be Solved by the Invention

In the case of above-described Patent Document 2, since an insulating body of a power line has a dual structure including a magnetic powder-mixed resin layer 6 and an insulation layer 7, mechanical characteristics and moldability are excellent, and a noise suppressing effect can be provided by the magnetic powder-mixed resin layer 6. Additionally, since a sheath layer 11 has a dual structure including the magnetic powder-mixed resin layer 6 and a protection sheet layer 12, mechanical characteristics and moldability are excellent, and noise suppressing effect can be provided. Furthermore, in Patent Document 2, even when noise from a signal line 3 leaks from a shield 9, the magnetic powder-mixed resin layer 6 can suppress the noise from entering a power line 2.

However, in Patent Document 2, since anti-noise measures related to the signal line 3 are taken by the shield 9 (braided wire), noise is generated from the shield 9. In Patent Document 2, no intervention may not be needed, and the noise is suppressed by the magnetic powder-mixed resin layer 6 located in the outer periphery. Therefore, in the case where the magnetic powder-mixed resin layer 6 has a thickness (volume) not enough for a noise amount, noise attenuation may be insufficient. Additionally, since the magnetic powder-mixed resin layer 6 for the power line 2 and the magnetic powder-mixed resin layer 6 for the sheath the layer 11 in an entire cable are provided, a coating process for the magnetic powder-mixed resin layer 6 is needed twice, and a manufacturing process of the cable may become complex.

In Patent Document 1 also, a braided copper wire is used for shielding. However, in the case of using the braided wire, there may be a problem called a big tail. The big tail will be described with reference to FIGS. 1A to 1C. As illustrated in FIG. 1A, a point of a portion 55 (called big tail) formed by bundling the braided wire 53 and shaped like a wire is connected to ground in a coaxial cable in which a periphery of an internal conductor 51 is covered with an insulation film 52, an outer peripheral surface of the insulation film 52 is provided with a braided wire 53, and an outer coat 54 is further provided.

As illustrated in FIGS. 1B and 1C, a circuit substrate 56 is housed inside a shield case 57. A signal pattern 58 and an earth pattern 59 are formed on the circuit substrate 56. The earth pattern 59 is connected to ground of the shield case 57. In the case of connecting the big tail 55 of the coaxial cable to the ground, possible methods may be: a method of connecting the big tail 55 to the shield case 57 as illustrated in FIG. 1B; and a method of connecting the big tail 55 to the earth pattern 59 as illustrated in FIG. 1C.

In the connecting method illustrated in FIG. 1B, a shielding effect is impaired by the big tail 55, and current of a signal is returned via the ground of the shield case 57 located at a place relatively distant. In this case, noise is induced to the ground by the current of the signal, thereby causing a problem in which the braided wire 53 functions a noise antenna.

In the connecting method illustrated in FIG. 1C, there is no problem of having a return route of the current of the signal, but the ground of the shield case 57 is separated from the ground of the coaxial cable. Therefore, the shielding effect is seriously impaired. Thus, in both Patent Document 1 and Patent Document 2 using the braided wire, the problem may be caused in terms of the shielding effect.

Therefore, the present disclosure is directed to providing a cable that solves such problems in the related arts.

Solutions to Problems

The present disclosure is a cable including: at least two signal cables formed of first and second signal cables for differential transmission; a third cable for ground; a fourth cable for power supply; a metal sheet adapted to cover the first and second signal cables; a coating material adapted to house the first and second signal cables covered with the metal sheet, and the third and fourth cables; and a magnetic powder-mixed resin filled into an inner space of the coating material and prepared by mixing magnetic powder with a resin.

Additionally, this is the cable in which a ferrite core that surrounds a partial section of the above-described cable is provided, and a molding resin is provided on an outer side of the ferrite core.

Effects of the Invention

According to at least one embodiment, a shielding effect can be obtained because the signal cables, power cable, and ground cable are covered with the insulation film and the magnetic powder-mixed resin. Since the signal cables are covered with the metal sheet, differential transmission of a high frequency signal can be performed without any problem even in the case where the magnetic powder-mixed resin covers outer peripheries of the signal cables. Additionally, the magnetic powder-mixed resin is not needed to be provided in a power line and an entire part of the cable, and a manufacturing process of the cable can be simplified. Note that the content of the present disclosure should not be understood in a manner limited by an effect exemplified in the following description.

MODE FOR CARRYING OUT THE INVENTION

In the following, embodiments of the present disclosure will be described with reference to the drawings. Note that the description will be provided in the following order.

<1. First Embodiment>
<2. Second Embodiment>
<3. Third Embodiment>
<4. Fourth Embodiment>
<5. Modified Example>

Note that the embodiments described below are preferred concrete examples of the present disclosure and various kinds of technically preferred limitations are provided, however; the scope of the present disclosure is not limited to these embodiments unless otherwise provided with a description that particularly limits the present disclosure in the following description.

1. First Embodiment

"Cable Structure"

Figure 1A:
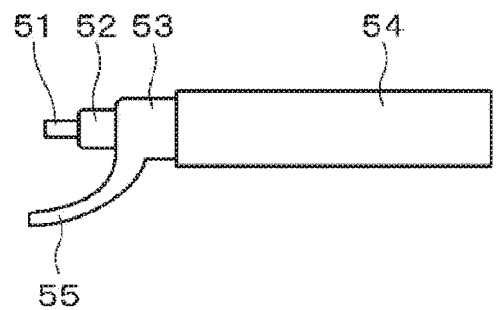
FIGS. 1A to 1C are schematic diagrams used to describe problems in the case of using a braided wire.
Figure 1B:
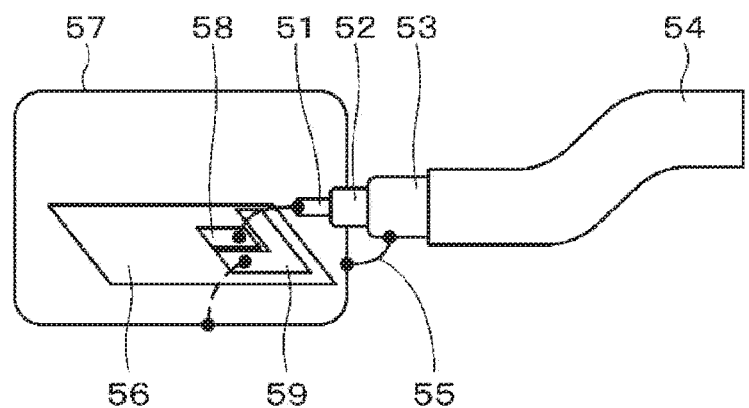
Figure 1C:
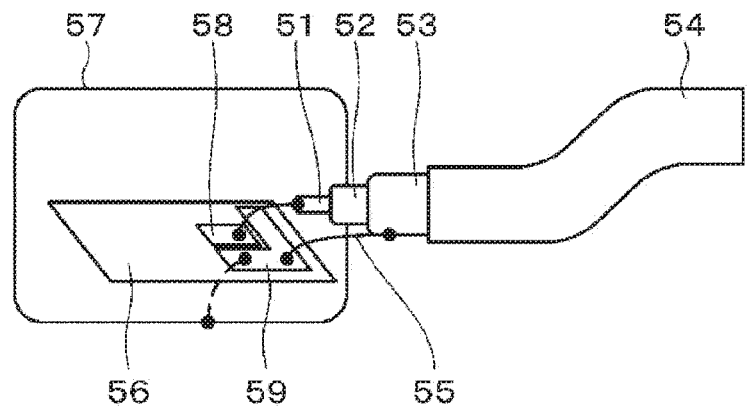
Figure 2:
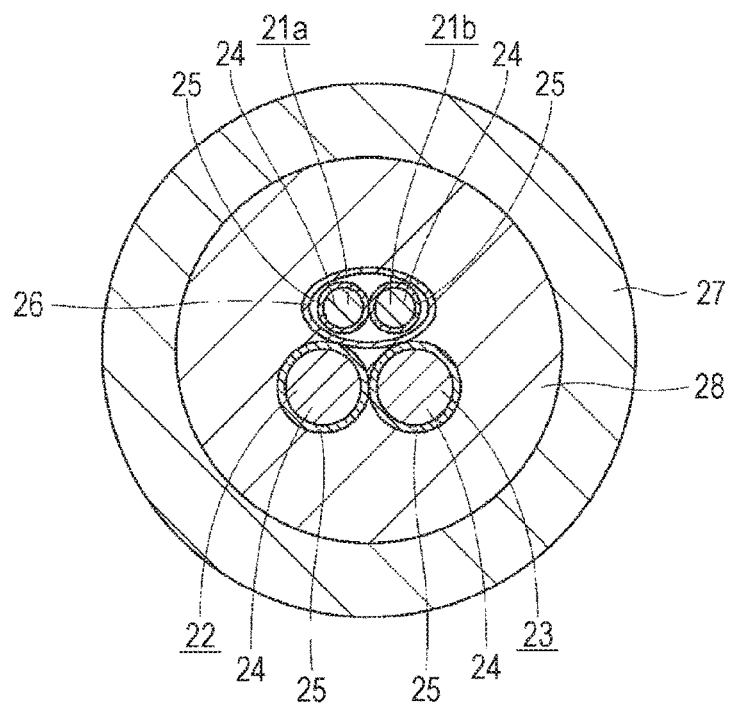
FIG. 2 is a horizontal sectional view of a cable according to a first embodiment of the present disclosure.

FIG. 2 is a horizontal sectional view of a cable according to a first embodiment of the present disclosure. The first embodiment is an example in which the present disclosure is applied to USB cable (USB Standard Type-A and Type-B). The USB cable has four cables (electric wires) including: a pair of cables formed of a first signal cable 21a and a second signal cable 21b for differential transmission (differential mode); a power cable 22; and a ground cable 23. Each of these cables 21a, 21b, 22, and 23 has a periphery of a conductive wire 24 as a core wire coated with an insulation film 25.

Figure 3:
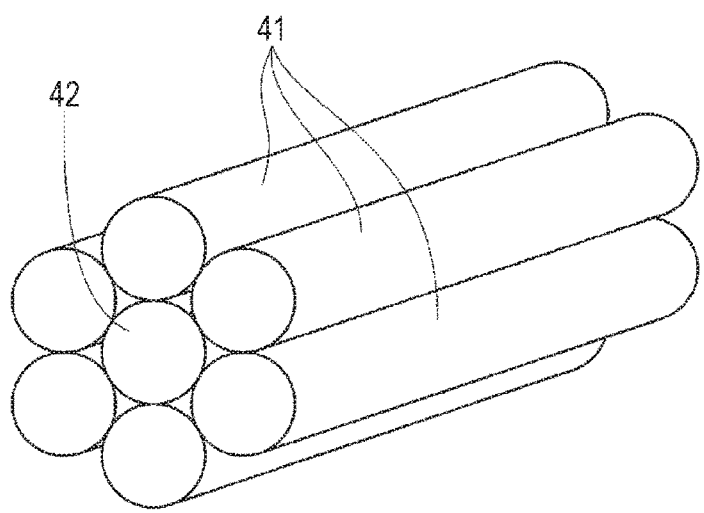
FIG. 3 is a perspective view of an exemplary cable according to the first embodiment of the present disclosure.

As the conductive wire 24, any one of a structure using copper and formed of a single conductive wire and a structure of a strand wire formed as one conductive wire by twisting thin conductive wires together may be used. In the case of using the strand wire, there may be a structure in which an aramid fiber thread 42 is disposed in a center portion of a plurality of copper wires 41 and the copper wires 41 and the thread 42 are twisted together as illustrated in FIG. 3 in order to ensure tensile strength and flexibility of a wire material. An insulation resin is provided for a portion obtained by twisting the copper wires 41 and the thread 42 together. The structure of FIG. 3 may be adopted by any one of the signal cables 21a, 21b, power cable 22, and ground cable 23. The signal cables 21a, 21b may be formed as a wire pair, for example.

The signal cables 21a and 21b are covered with a metal sheet 26. The metal sheet 26 may adopt a structure covered with copper or an aluminum foil, a structure of wrapping an aluminum ribbon around the signal cables 21a and 21b, and a structure of combining these two methods. Since the metal sheet 26 is not connected to the ground, there is an advantage of having no big tail problem caused by using a braided wire.

The signal cables 21a and 21b covered with the metal sheet 26, the power cable 22, and the ground cable 23 are covered with a coating material 27. The magnetic powder-mixed resin 28 is filled into the coating material 27. The magnetic powder-mixed resin 28 intervenes between an inner peripheral surface of the coating material 27 and the signal cables 21a and 21b, power cable 22, and ground cable 23. Since the signal cables 21a and 21b are covered with the metal sheet 26, a signal can be transmitted without influence of the magnetic powder-mixed resin 28.

As the insulation film 25 of the conductive wire 24 and the coating material 27, various kinds of materials can be used. For example, materials such as polyethylene, polypropylene, polyvinyl chloride (PVC), and elastomer can be used.

The magnetic powder-mixed resin 28 is obtained by mixing magnetic powder with a synthetic resin. An exemplary synthetic resin is styrene elastomer. Besides, synthetic resins such as olefin elastomer and PVC may also be used. Exemplary magnetic powder is Ni—Zn-based ferrite. According to an exemplary mixture ratio, ferrite is 89 wt %. As the magnetic powder, Ni—Cu—Zn-based ferrite, Mn—Zn-based ferrite, and magnetic powder of soft magnetic metal-base, copper-base, magnesium-base, lithium-base, zinc-base, iron-base (e.g., permalloy), and cobalt-base may also be used.

The mixture ratio is not limited to the above-described percentage. The higher the mixture ratio of the magnetic powder is, the better a characteristic to absorb high-frequency noise can be achieved. However, since mechanical characteristics such as moldability, flexibility, and tensile strength are deteriorated, a ratio is set so as to satisfy both characteristics. Generally, the high-frequency noise can be absorbed when the ratio of ferrite is 70 wt % or more and 95% or less.

Figure 4:
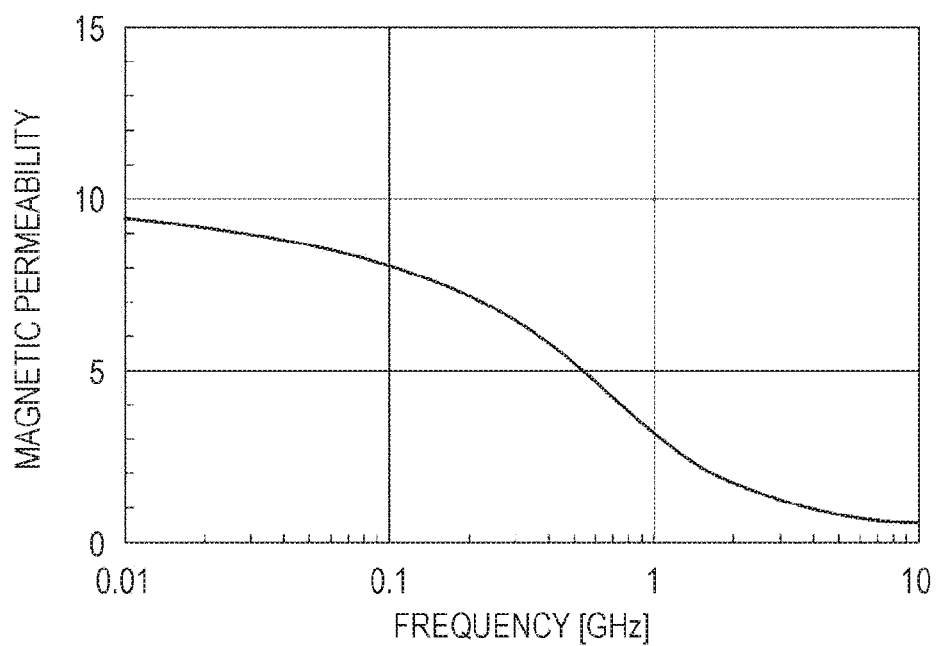
FIG. 4 is a graph illustrating frequency characteristics of magnetic permeability of a magnetic powder-mixed resin.

FIG. 4 illustrates frequency characteristics of magnetic permeability of the magnetic powder-mixed resin 28 obtained by mixing Ni—Zn-based ferrite with a styrene elastomer compound at the above-described ratio.

"Transmission Characteristics of First Embodiment"

In the above-described first embodiment of the present disclosure, the signal cables 21a, 21b are shielded by the metal sheet 26, and an outer side thereof is coated with the magnetic powder-mixed resin 28, and furthermore, the outside thereof is coated with the coating material 27. With this structure, it is confirmed that signal can be properly transmitted.

As a reference example 1, differential transmission of a high-frequency signal is performed with two cables corresponding to the signal cables 21a, 21b. In this case, a shielding material like the metal sheet 26 is not provided at the cables. Additionally, a ferrite core having a cylindrical body is used as a member corresponding to the magnetic powder-mixed resin 28, and each of the cables is set so as to pass through a center hole of the ferrite core. The two ferrite cores where the respective cables pass through near an input port, and two ferrite cores where the respective cables pass through near an output port are used.

A coil is formed by the cable passing through the center hole of the ferrite core having a cylindrical shape (or ring shape). Therefore, the higher the frequency is, the higher impedance is. Additionally, when current flows in the coil formed of the ferrite core, there is an effect that energy is lost by a magnetic loss generated at the ferrite core, and impedance (resistant component) is increased. Impedance characteristics in the case of using the ferrite core are determined by a material of the ferrite core, a size of the cylindrical body formed by the ferrite core (length, diameter, and diameter of the center hole), the number of turns, and the like. The structure where the cable passes through the center hole of the cylindrical body formed of the ferrite core is referred to as one turn, and the structure where the cable is once wound around the cylindrical body is referred to as two turns. The more the number of turn is, the higher the impedance is.

Figure 5:
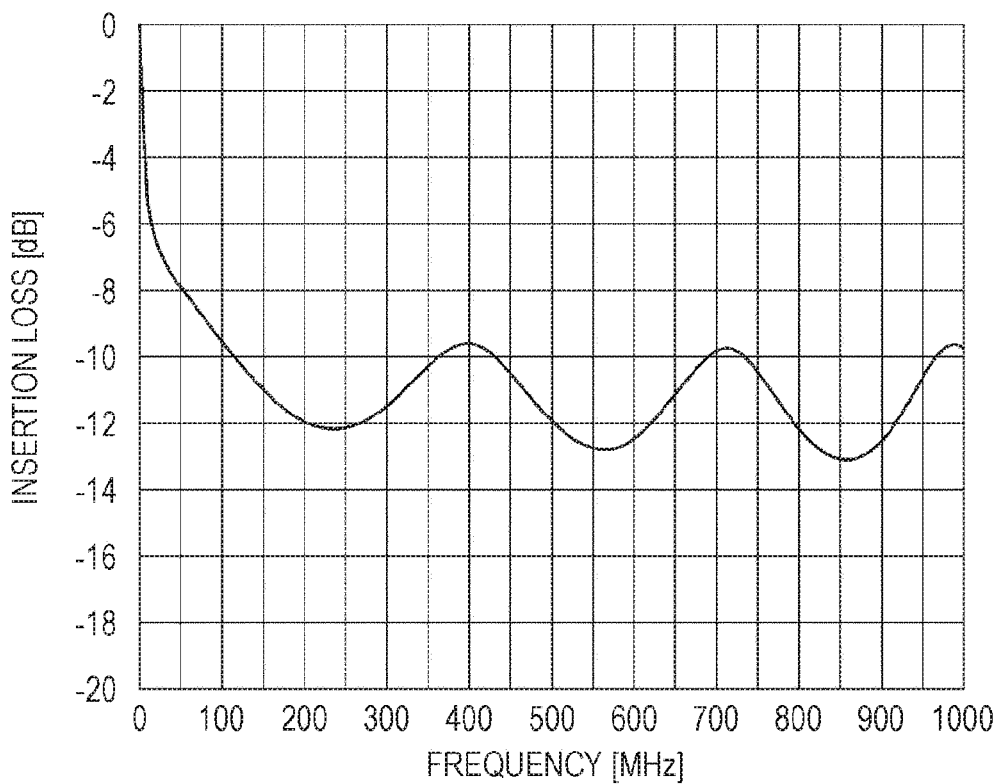
FIG. 5 is a graph used to describe signal transmission characteristics of the present disclosure.

Thus, in the case of the reference example 1 in which the ferrite core is used without covering the signal cable with the metal sheet, transmission characteristics illustrated in FIG. 5 are obtained. In other words, signal transmission is not normally performed by the ferrite core. A horizontal axis represents a frequency, and a vertical axis represents an insertion loss.

Figure 6:
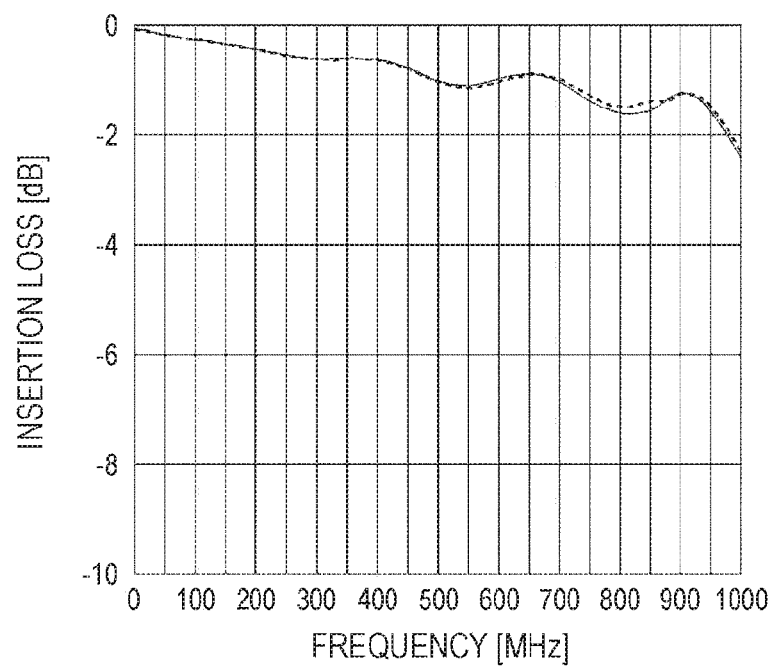
FIG. 6 is a graph used to describe signal transmission characteristics of the present disclosure.

Next, a study result of transmission characteristics related to a reference example 2 having a structure in which two cables same as the reference example 1 are provided as a twist pair and further covered with a braided shield is illustrated as frequency characteristics indicated by a dotted line in FIG. 6. Similar to FIG. 5, a horizontal axis represents a frequency, and a vertical axis represents an insertion loss. As illustrated in FIG. 6, in the case of the reference example 2, a signal is transmitted from an input side to an output side with little attenuation amount. Therefore, signal transmission is normally performed.

Furthermore, transmission characteristics related to a structure in which each of the cables is made to pass through a ferrite core (the one same as the reference example 1) in the reference example 2 (structure similar to the present disclosure) are indicated as a solid line in FIG. 6. As it can be grasped from the graph of FIG. 6, even when the ferrite core is provided, the transmission characteristics can be little changed by providing a shield. Therefore, the first embodiment of the present disclosure can normally transmit a signal even when the outside of the signal cables 21a, 21b for differential transmission is covered with the magnetic powder-mixed resin 28.

2. Second Embodiment

Figure 7:
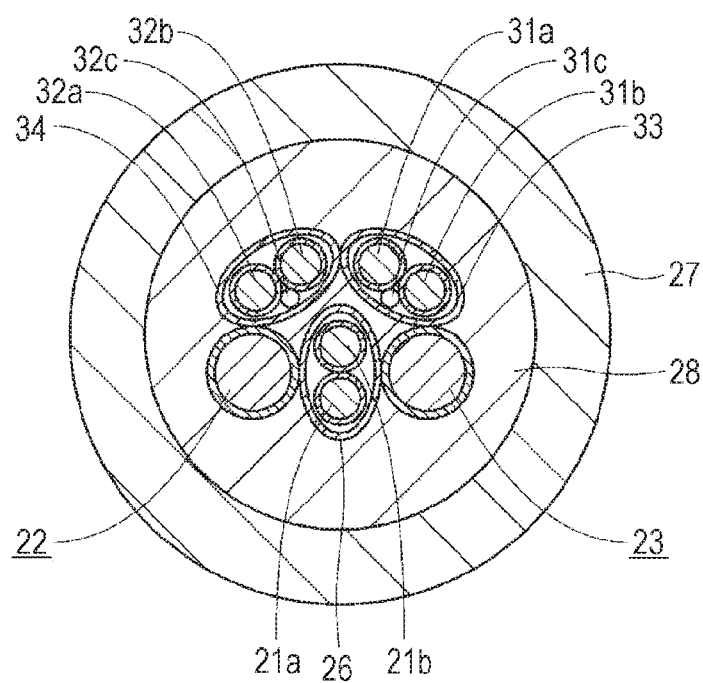
FIG. 7 is a horizontal sectional view of a cable according to a second embodiment of the present disclosure.

A second embodiment of the present disclosure applied to a Type-C newly added in accordance with the USB 3.1 standard will be described with reference to FIG. 7. FIG. 7 is a horizontal sectional view of the second embodiment. A first embodiment described above can be applied to any one of a Type-A and a Type-B of the USB standard. The standard of the Type-C can perform bidirectional transmission and power supply, and supports a maximum data transfer rate (10 Gbps (USB 3.1 standard)).

As illustrated in FIG. 7, similar to the first embodiment, signal cables 21a, 21b each attached with an insulation film are covered with a metal sheet 26, and a power cable 22 and a ground cable 23 each attached with an insulation film are provided. The signal cables 21a, 21b are referred to as C-signal cables (for differential transmission).

In the second embodiment, A-signal cables (for differential transmission) 31a, 31b and a drain 31c are covered with a metal sheet 33, B-signal cables (for differential transmission) 32a, 32b and a drain 32c are covered with a metal sheet 34. The drains 31c and 32c do not have any insulation film.

In the above-described second embodiment also, each of the cables is shielded by a coating material 27 and a magnetic powder-mixed resin 28 in a manner similar to the first embodiment. Therefore, problems such as noise emission to the outside and noise entrance from the outside can be suppressed. Furthermore, since the respective signal cables are covered with the metal sheets 26, 33, and 34, the magnetic powder-mixed resin 28 prevents occurrence of a problem of not normally performing a high-frequency signal transmission.

3. Third Embodiment

Figure 8A:
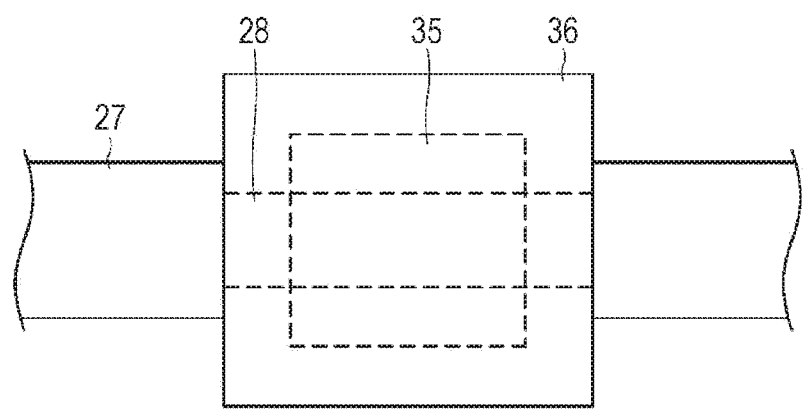
FIGS. 8A and 8B are a schematic diagram and a horizontal sectional view of a cable according to a third embodiment of the present disclosure.
Figure 8B:
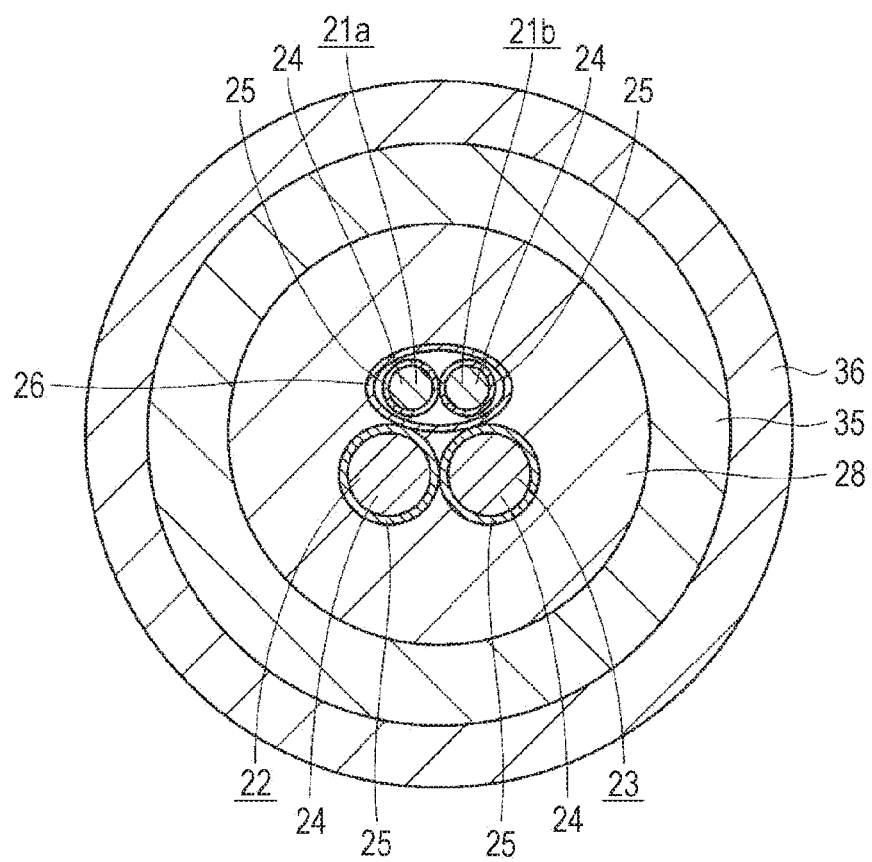

A third embodiment of the present disclosure will be described with reference to FIGS. 8A and 8B. A coating material 27 in a partial section at an appropriate place (one or plural places) of a cable according to above-described first embodiment is removed, and a magnetic powder-mixed resin 28 is exposed. A ferrite core 35 molded in a cylindrical shape is disposed in the section where the magnetic powder-mixed resin 28 is exposed. An inner diameter of the ferrite core 35 is formed slightly larger than an outer diameter of the magnetic powder-mixed resin 28.

Furthermore, a molding resin 36 to cover an entire portion of the ferrite core 35 is provided. The molding resin 36 is a molding resin mixed with ferrite. Thus, noise removal performance can be improved by inserting the ferrite core 35 in the middle of the cable and covering the same with the molding resin 36. Meanwhile, the coating material 27 is not necessarily removed, and the molding resin 36 does not necessarily include ferrite.

4. Fourth Embodiment

Figure 9:
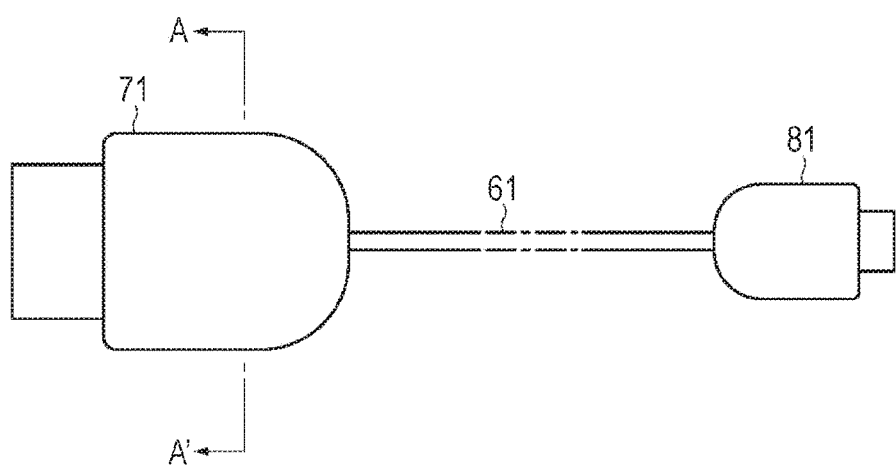
FIG. 9 is a schematic diagram of a cable according to a fourth embodiment of the present disclosure.
Figure 10:
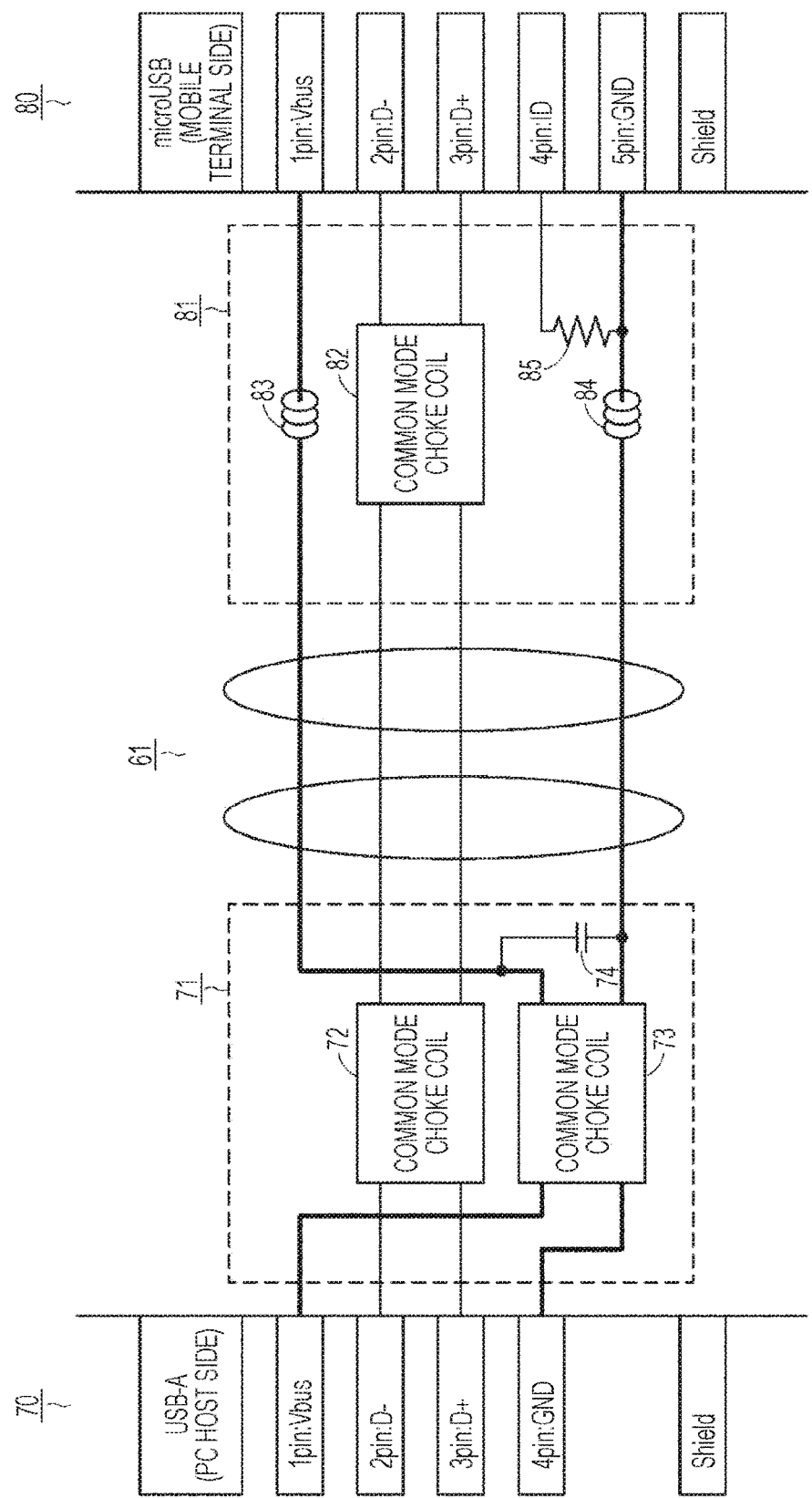
FIG. 10 is a connection diagram of the cable according to the fourth embodiment of the present disclosure.

Next, a fourth embodiment of the present disclosure will be described. As illustrated in FIG. 9, the fourth embodiment relates to anti-noise measures for a cable having an exemplary form in which a standard USB connector (Type-A) 71 is connected to one end of a cable 61 and a micro (suitably abbreviated as μ) USB connector (Type-A) 81 is connected to the other end. The standard USB connector (hereinafter simply referred to as USB connector) 71 is connected to a host side (personal computer, electric charger (so-called AC adapter), and the like) and the μUSB connector 81 is connected to a device side (smartphone, tablet, and the like). As the cable 61, a cable having excellent noise suppression performance according to the above-described present disclosure or a cable with an existing shield is used.

As illustrated in FIG. 5, for example, the USB connector 71 is connected to a receptacle of a personal computer 70, and the μUSB connector 81 is connected to a receptacle of a mobile terminal 80. The USB connector 71 has following pin arrangement.

Pin 1: Vbus, Pin 2: D−, Pin 3: D+, Pin 4: GND

The μUSB connector 81 has following pin arrangement.

Pin 1: Vbus, Pin 2: D−, Pin 3: D+, Pin 4: ID, Pin 5: GND

Two terminals on one side of a common mode choke coil (also may be referred to as common mode filter) 72 are connected to data terminals D− and D+ of the USB connector 71. Two terminals on the other side of the common mode choke coil 72 are connected to two terminals on one side of a common mode choke coil 82 provided at the μUSB connector 81 via the cable 61. Two terminals on the other side of the common mode choke coil 82 are connected to the data terminals D− and D+.

Two terminals on one side of a common mode choke coil 73 are connected to power source terminals Vbus and GND of the USB connector 71. A noise removal capacitor 74 is inserted between two terminals on the other side of the common mode choke coil 73. The two terminals on the other side of the common mode choke coil 73 are connected to power source terminals Vbus and a GND via the cable 61 and ferrite beads 83 and 84 provided at the μUSB connector 81. An identification resistance 85 is connected between an identification terminal ID and the power source terminal GND.

The two common mode choke coils 72 and 82 are inserted to a data transmission line, but one of these common mode choke coils may also be omitted. A common mode choke coil for a power line may also be provided instead of the ferrite beads in μUSB connector 81. Meanwhile, in the case of the connector standard of a USB Type-C, the connector can be used in both the host side and the device side. Therefore, in this case, common mode choke coils are needed to be mounted on the both-side connectors.

The common mode choke coil is formed by winding two coils around a common core in opposite directions. In the common mode choke coils 72 and 82, coils are respectively inserted into two data lines. In the common mode choke coil 73, coils are respectively inserted into two power lines.

The common mode choke coil allows signal current to pass in a differential mode, and can remove noise current of the common mode. In other words, in the case of the differential mode, flow directions of current flowing in the two coils are opposite and the current does not function as an inductor. In the case of a common mode, the current flowing in the two coils flows in the same direction and functions as the inductor. Since noise is the common mode, the noise can be removed. Actually, since a magnetic flux generated in each coil partly becomes a leaked magnetic flux, an inductance component does not become zero. Therefore, there may be a case where such an inductance component cannot be ignored in a region having an extremely high signal frequency. Furthermore, noise can be removed by the noise removal capacitor 74. Noise having a high frequency can be removed by the ferrite beads 83 and 84.

Thus, by improving noise removal performance for power transmission, it is possible to prevent a reception level of the mobile terminal 80 from being degraded due to noise generated in an electric charger or a personal computer connected with the USB connector 71.

Figure 11:
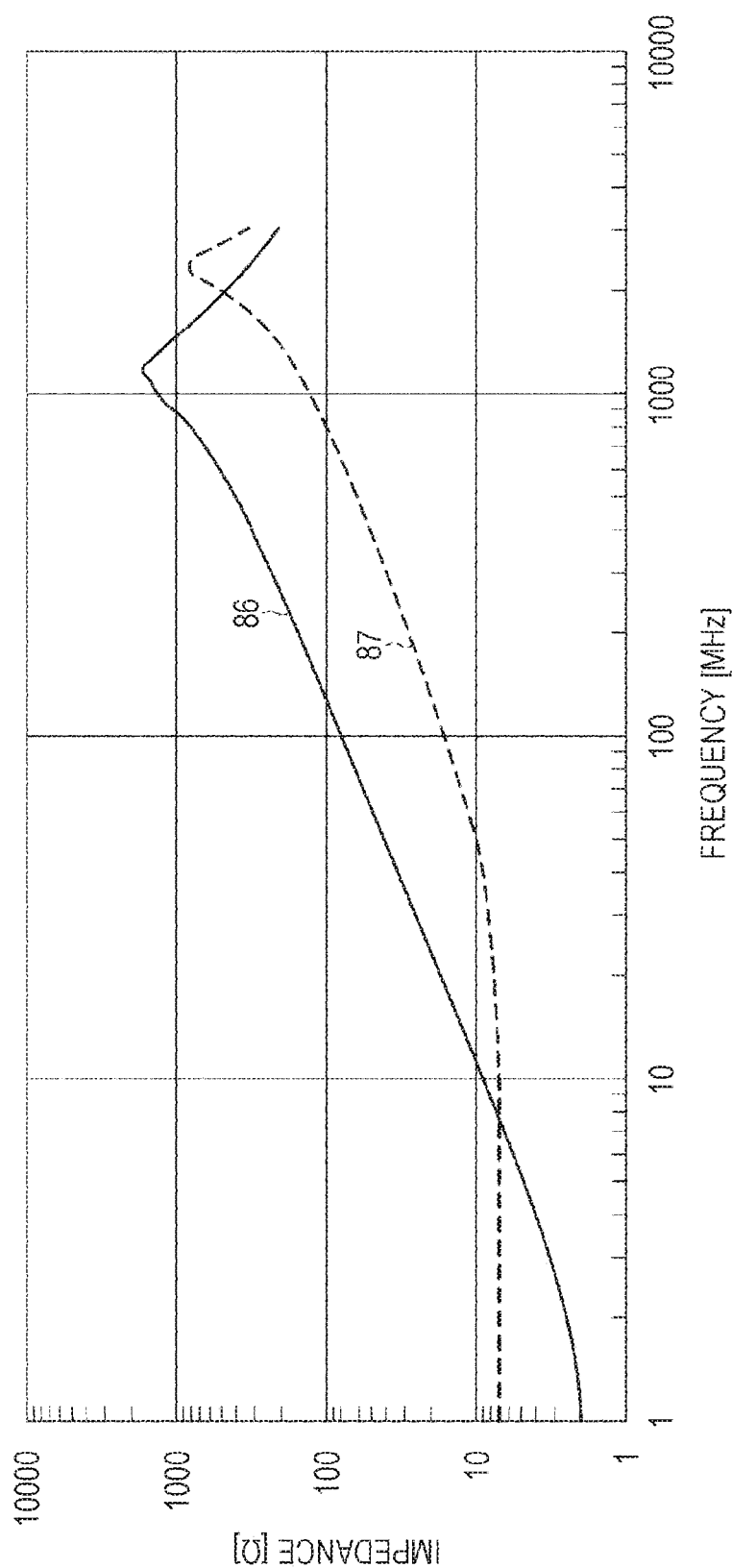
FIG. 11 is a graph of impedance frequency characteristics of a common mode choke coil for a signal.

FIG. 11 illustrates impedance frequency characteristics of the common mode choke coil 72 (82) for a signal. Characteristics indicated by a solid line 86 are the impedance frequency characteristics relative to the common mode, and a dotted line 87 indicates the impedance frequency characteristics relative to the differential mode. For example, impedance relative to the differential mode is low in the vicinity of 100 MHz, and little influence is given to signal transmission.

Figure 12:
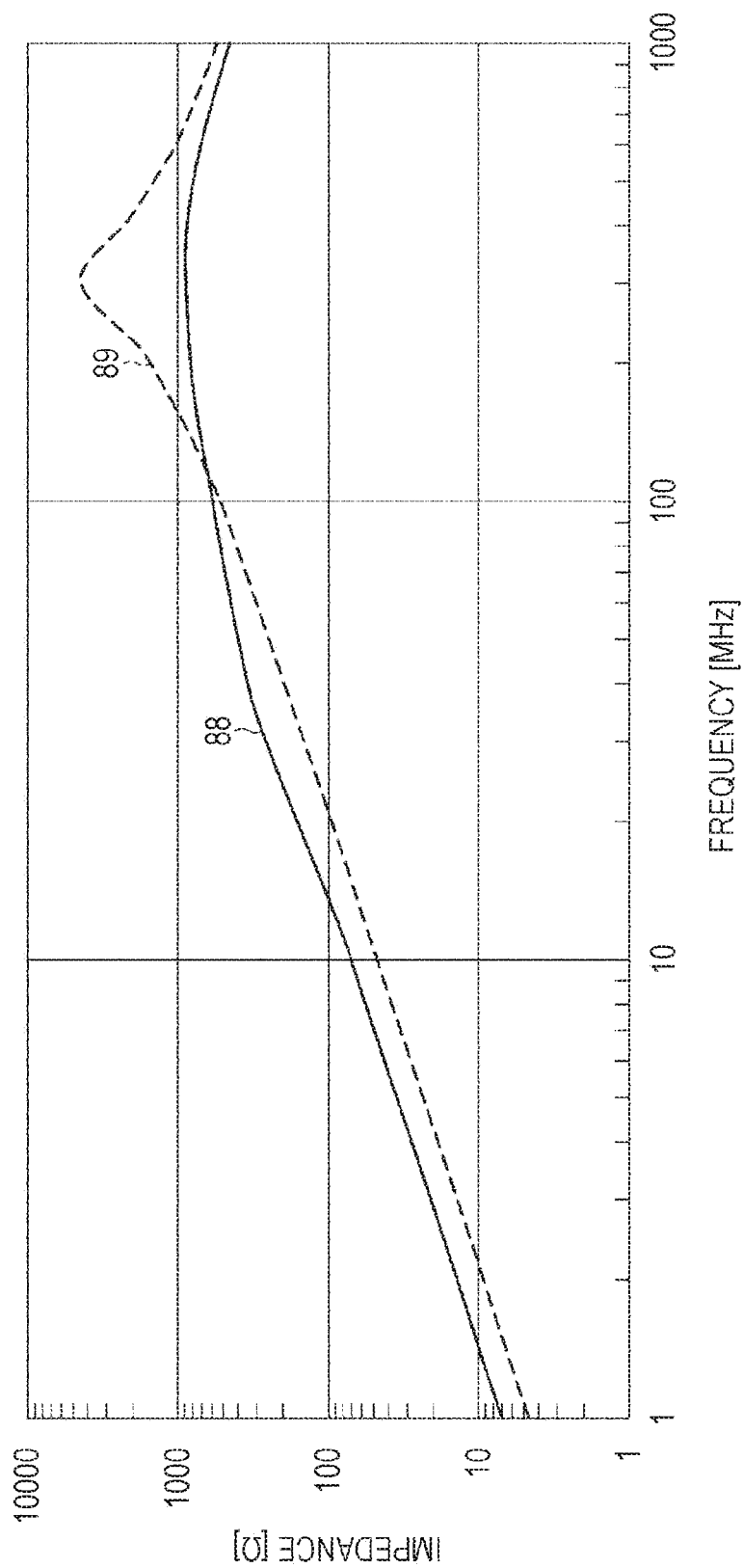
FIG. 12 is a graph of impedance frequency characteristics of a common mode choke coil for power source.

FIG. 12 illustrates impedance frequency characteristics of the common mode choke coil 73 for a power source. Characteristics indicated by a solid line 88 are the impedance frequency characteristics relative to the common mode, and a dotted line 89 indicates the impedance frequency characteristics relative to the differential mode. For example, impedance relative to both of the common mode and the differential mode is relatively high in the vicinity of 100 MHz, and a high frequency component (namely, noise) can be suppressed in both of the modes.

Figure 13:
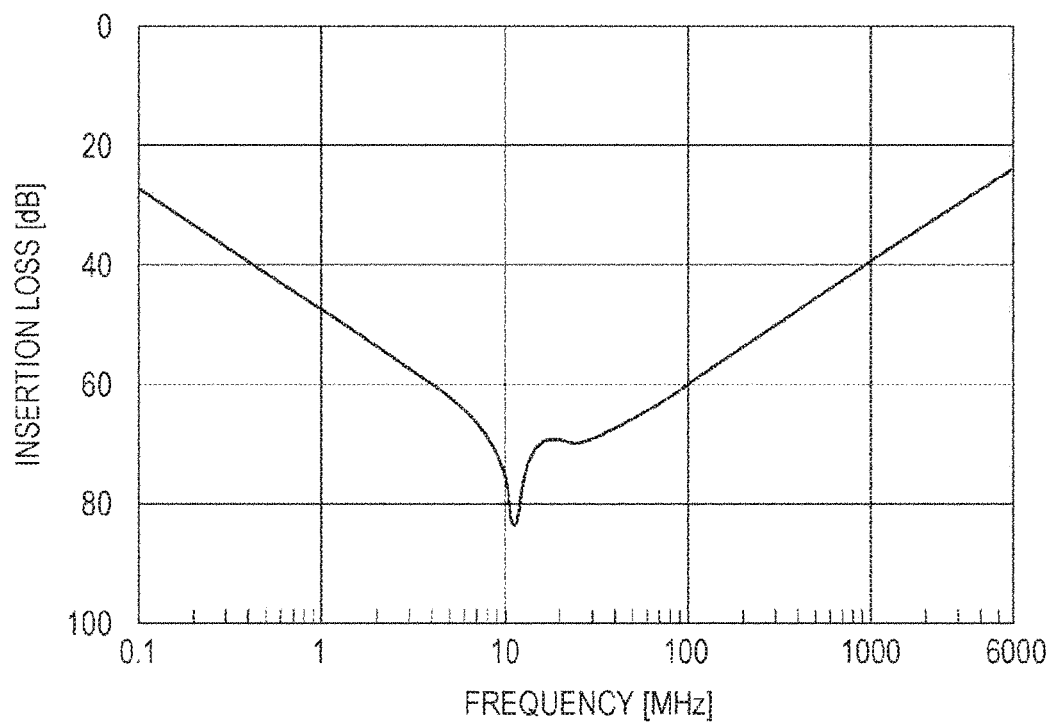
FIG. 13 is a graph of insertion loss frequency characteristics of noise removal capacitor.

FIG. 13 illustrates insertion loss frequency characteristics of the noise removal capacitor 74. For example, a value of the capacitor 74 is set to 1.5 μF. Noise can be suppressed by the capacitor 74.

Figure 14:
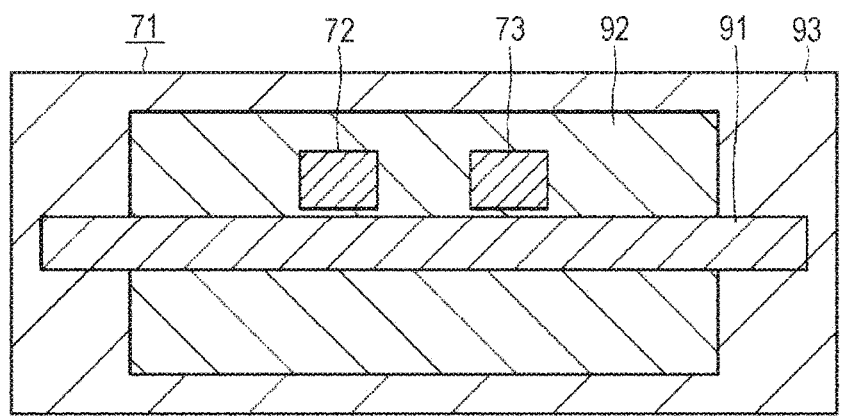
FIG. 14 is a cross-sectional view of an exemplary USB connector.

In the fourth embodiment, measures for shielding the USB connector 71 and the μUSB connector 81 are additionally taken. FIG. 14 is a schematic cross-sectional view of, for example, the USB connector 71 taken along an A-A line in FIG. 9. Components of the common mode choke coils 72, 73 and the like are mounted on a printed circuit board 91.

The printed circuit board 91 and the common mode choke coils 72, 73 have a structure covered with a resin. The resin is formed of: a layer of a non-conductive resin 92 such as polypropylene adapted to directly cover the common mode choke coils 72, 73; and a layer of a conductive resin 93 located outside thereof. The conductive resin 93 is a resin that is obtained by filling carbon in a resin and can be molded, and has a shielding effect against electromagnetic waves, such as absorption and reflection. A resin (ferrite resin) that is obtained by filling ferrite in a resin and can be molded may also be used instead of the conductive resin 93.

A method of manufacturing the USB connector 71 thus configured will be described. Chip components (common mode choke coils 72, 73 and the like) for anti-noise measures are mounted on the printed circuit board 91, and then the connector and the printed circuit board 91 are soldered. After that, primary molding is performed with the non-conductive resin 92 while a wire material is connected to the printed circuit board 91 by soldering. Next, molding is performed with the conductive resin 93 (or ferrite resin), and a connector portion is formed. Since only the resin is used for manufacture, a manufacturing time can be shortened, and furthermore, since covering is provided with the resin without any clearance, shielding performance can be improved.

Figure 15:
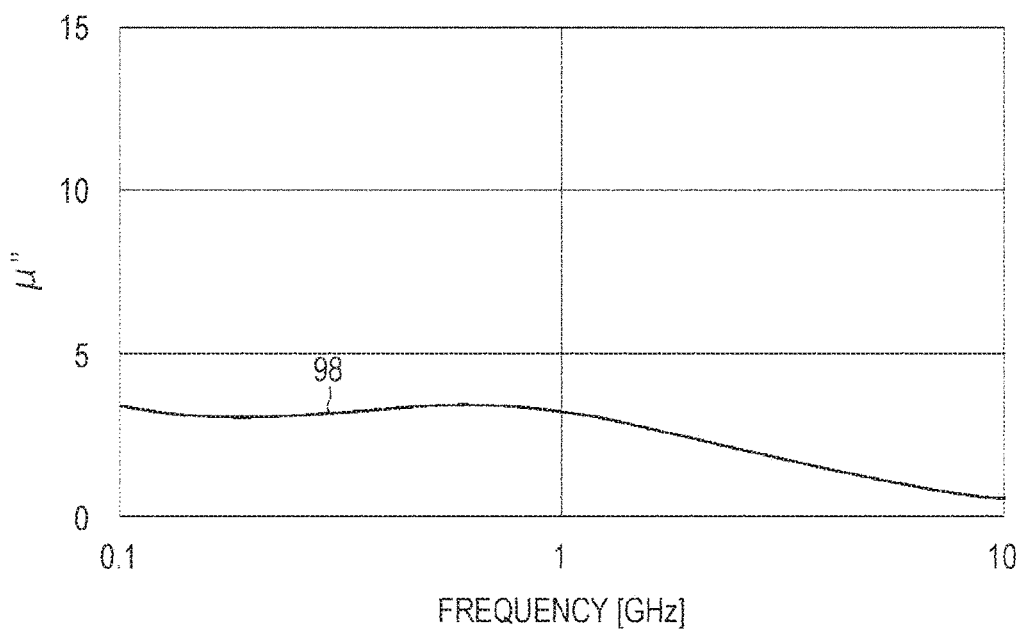
FIG. 15 is a graph of frequency characteristics of a loss factor of a molding resin.

FIG. 15 illustrates frequency characteristics of an exemplary loss factor μ" of the ferrite resin. For example, illustrated are frequency characteristics when polypropylene is used and a weight filling rate of ferrite is 80%. As it can be grasped from FIG. 15, when the frequency is low, the loss factor μ" of approximately 4 can be obtained.

Figure 16:
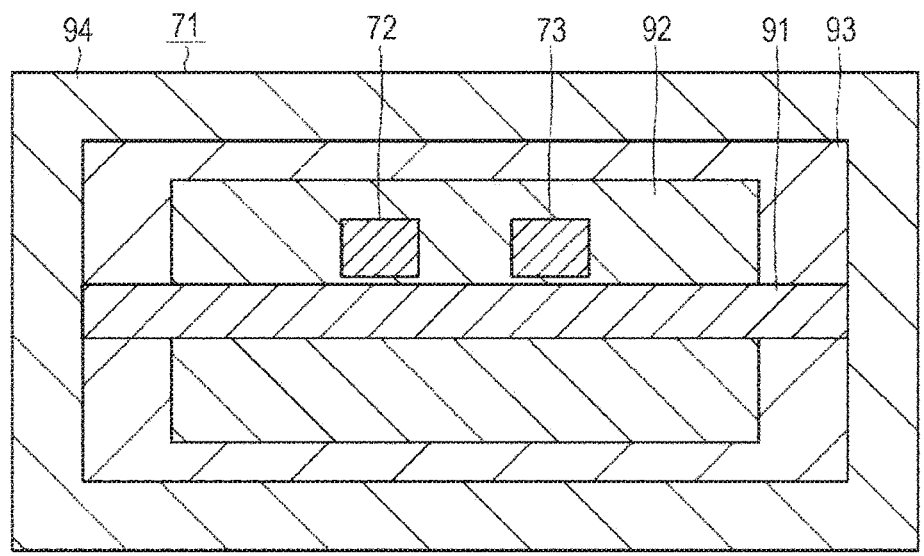
FIG. 16 is a cross-sectional view of another exemplary USB connector.

As illustrated in FIG. 16, it may also be possible to have a structure in which the outer side of the above-described USB connector 71 is covered with a non-conductive resin 94. In other words, that is the structure in which the chip components for anti-noise measures are covered with a three-layer structure (non-conductive resin 92, conductive resin 93, and non-conductive resin 94). The three-layer structure can implement more improved shield performance.

5. Modified Example

While the embodiments of the present disclosure have been concretely described above, the present disclosure is not limited to the above-described embodiments, and various kinds of modifications can be made on the basis of the technical idea of the present disclosure. For example, the configuration, methods, processes, shapes, materials, and values exemplified in the above-described embodiments are merely examples, and as the case may be, a configuration, a method, a process, a shape, a material, and a value different therefrom may also be used. For example, the present disclosure may also be applicable to a cable or a connector of the USB Type-C standard.

Additionally, not limited to the USB cable, the present disclosure may be applicable to a cable of HDMI (registered trademark), a cable of Institute of Electrical and Electronics Engineers (IEEE) 1394, and the like. In other words, in the case of the standard of the HDMI (registered trademark), various kinds of packet data of a video and an audio is transmitted by a system called transition minimized differential signaling (TMDS). As for TMDS channels, three channels for data and one channel for a clock are prepared. For example, a transmission line of the channels for data and a clock are covered with a metal sheet and a magnetic powder-mixed resin is filled, thereby achieving effects similar to those described above.

Note that the present disclosure can also have the following configurations.

(1)
A cable including: at least two signal cables formed of first and second signal cables for differential transmission; a third cable for ground; a fourth cable for power supply; a metal sheet adapted to cover the first and second signal cables; a coating material adapted to house the first and second signal cables covered with the metal sheet, and the third and fourth cables; and a magnetic powder-mixed resin filled into an inner space of the coating material and prepared by mixing magnetic powder with a resin.

A cable including: at least two signal cables formed of first and second signal cables for differential transmission; a third cable for ground; a fourth cable for power supply; a metal sheet to cover the first and second signal cables; a coating material adapted to house the first and second signal cables covered with the metal sheet, and the third and fourth cables; and a magnetic powder-mixed resin filled into a space generated after housing the cables in an inner space of the coating material and prepared by mixing magnetic powder with a resin.

(2)
The cable recited in (1), wherein a mixing ratio of magnetic powder of the magnetic powder-mixed resin is 70 wt % or more.

(3)
The cable recited in (1) or (2), wherein the magnetic powder is ferrite or permalloy.

(4)
The cable recited in any one of (1), (2), and (3), wherein the first and second cables are twisted together.

(5)
The cable recited in any one of (1), (2), (3), and (4), wherein the first and second signal cables are formed of a plurality of copper wires and an aramid fiber.

(6)
The cable recited in (5), wherein a coating film of the first and second signal cables formed of the plurality of copper wires and the aramid fiber is formed of an insulation resin.

(7)
The cable recited in any one of (1), (2), (3), (4), (5), and (6), wherein the third and fourth cables are formed of a plurality of copper wires and an aramid fiber.

(8)
The cable recited in (7), wherein a coating film of the third and fourth cables formed of the plurality of copper wires and the aramid fiber is formed of an insulation resin.

(9)
The cable recited in any one of (1), (2), (3), (4), (5), (6), (7), and (8), wherein a drain is covered with the metal sheet together with the first and second signal cables.

(10)
The cable recited in any one of (1), (2), (3), (4), (5), (6), (7), (8), and (9) used for transmission based on a USB standard.

(11)
A cable including a ferrite core adapted to surround a partial section of a cable recited in (1), and provided with a molding resin on an outer side of the ferrite core.

(12)
The cable recited in (11), wherein the molding resin is mixed with magnetic powder.

(13)
The cable recited in (11), wherein a coating material in the partial section is removed.

REFERENCE SIGNS LIST 21a, 21b, 31a, 31b, 32a, 32b Signal cable
22 Power cable
23 Ground cable
26, 33, 34 Metal sheet
27 Coating material
28 Magnetic powder-mixed resin

The invention claimed is:

1. A cable, comprising:
   at least a first signal cable and a second signal cable for differential transmission;
   a third cable for ground;
   a fourth cable for power supply;
   a metal sheet configured to cover the first signal cable and the second signal cable;
   a coating material configured to house the first signal cable, the second signal cable, the third cable and the fourth cable; and
   a magnetic powder-mixed resin filled into a space between an inner peripheral surface of the coating material and the metal sheet, the third cable, and the fourth cable,
   wherein the magnetic powder-mixed resin is a mixture of magnetic powder and a resin.

2. The cable according to claim 1, wherein a mixing ratio of the magnetic powder in the magnetic powder-mixed resin is 70 wt % or more.

3. The cable according to claim 1, wherein the magnetic powder is one of ferrite or permalloy.

4. The cable according to claim 1, wherein the first signal cable is twisted with the second signal cable.

5. The cable according to claim 1, wherein each of the first signal cable and the second signal cable comprises a plurality of copper wires and an aramid fiber.

6. The cable according to claim 5, further comprising a coating film of an insulation resin on each of the first signal cable and the second signal cable.

7. The cable according to claim 1, wherein each of the third cable and the fourth cable comprises a plurality of copper wires and an aramid fiber.

8. The cable according to claim 7, further comprising a coating film of an insulation resin on each of the third cable and the fourth cable.

9. The cable according to claim 1, further comprising a drain, wherein the drain is covered with the metal sheet.

10. The cable according to claim 1, wherein a transmission via the cable is based on a USB standard.

11. The cable according to claim 1, further comprising:
    a ferrite core configured to surround a partial section of the cable; and
    a molding resin on an outer side of the ferrite core.

12. The cable according to claim 11, wherein the molding resin is mixed with the magnetic powder.

* * * * *